(12) United States Patent
Leuschner

(10) Patent No.: US 7,617,019 B2
(45) Date of Patent: Nov. 10, 2009

(54) VENTILATION DEVICE

(75) Inventor: Klaus Leuschner, Vaterstetten (DE)

(73) Assignee: Siemens Aktiengesellschaft, Munich (DE)

( * ) Notice: Subject to any disclaimer, the term of this patent is extended or adjusted under 35 U.S.C. 154(b) by 952 days.

(21) Appl. No.: 10/519,139

(22) PCT Filed: Jan. 21, 2004

(86) PCT No.: PCT/EP2004/000439

§ 371 (c)(1),
(2), (4) Date: Dec. 22, 2004

(87) PCT Pub. No.: WO2004/086835

PCT Pub. Date: Oct. 7, 2004

(65) Prior Publication Data

US 2005/0247438 A1   Nov. 10, 2005

(30) Foreign Application Priority Data

Mar. 28, 2003   (DE) ............................... 103 14 167

(51) Int. Cl.
*G05D 23/00* (2006.01)
*G06F 1/00* (2006.01)
*H02P 6/06* (2006.01)

(52) U.S. Cl. .................. 700/300; 713/300; 318/400.05

(58) Field of Classification Search ................. 700/300, 700/28; 318/400.08, 471, 565, 400.05; 702/130, 702/132, 185, 188; 236/49.1, 49.3, 49.5; 165/80.2, 244, 247; 361/695; 388/804; 60/708; 713/300, 330, 340
See application file for complete search history.

(56) References Cited

U.S. PATENT DOCUMENTS

| 4,817,865 A | 4/1989 | Wray |
| 6,018,456 A * | 1/2000 | Young et al. ................. 361/684 |
| 6,021,042 A | 2/2000 | Anderson et al. |
| 6,101,459 A | 8/2000 | Tavallaei et al. |
| 6,340,874 B1 | 1/2002 | Vladimir |
| 6,428,282 B1 | 8/2002 | Langley |
| 2002/0059533 A1 | 5/2002 | Kaminski et al. |
| 2003/0011332 A1* | 1/2003 | Mays, II ..................... 318/254 |

FOREIGN PATENT DOCUMENTS

DE   101 14 639 A1   9/2002

* cited by examiner

*Primary Examiner*—Paul L Rodriguez
*Assistant Examiner*—Sheela Rao

(57) ABSTRACT

The invention relates to a ventilation device for artificially ventilating component groups mounted on the support thereof. The inventive ventilation device comprises at least a fan group connected to a power supply unit by means of connecting wires, and a control unit for controlling the ventilation carried out by the ventilation group of ventilation groups. Said control unit controls a control element arranged in the connecting wires power circuit. Each component group is provided with a temperature control device actuating a switch, which is arranged in a parallel direction with respect to the control element, when the temperature of the corresponding component group is higher than a limiting temperature.

13 Claims, 5 Drawing Sheets

VENTILATION DEVICE

CROSS REFERENCE TO RELATED APPLICATIONS

This application is the US National Stage of International Application No. PCT/EP2004/000439, filed Jan. 21, 2004 and claims the benefit thereof. The International Application claims the benefits of German application No. 10314167.7 filed Mar. 28, 2003, both applications are incorporated by reference herein in their entirety.

FIELD OF THE INVENTION

The invention relates to a ventilation device for artificially ventilating component groups mounted on a subrack, and comprises at least one fan unit connected to a power supply unit by means of connecting wires, as well as a control unit for monitoring the ventilation of the at least one fan unit, whereby the control unit controls a control element arranged in the power circuit of the connecting wires.

BACKGROUND OF THE INVENTION

Ventilators are used to dissipate heat from a subrack, said ventilators generating a forced air flow which is directed past the component groups to be ventilated. RPM-regulated electrical drives which are controlled by a control unit are generally used.

The reliability of a system with electronic and/or electrical component groups depends decisively on the operability of the ventilation system. If the ventilation system fails, local overheating of components takes place, which consequently results in functional impairments or in a total system failure.

In safety-critical systems, it is conventional for ventilation systems to be configured redundantly. Several ventilators are operated in parallel, each being controlled by redundantly configured control electronics. Speed-regulated electromotors are generally used. Speed regulation is carried out by means of a switching element arranged in the power circuit of the connecting wires, said switching element being clocked for instance using pulse width modulation. Even if for reasons of cost the rotational speed is determined only at a master drive and fed back to the controller, the redundantly configured control electronics require a cost outlay which is too large for many applications.

Patent specification U.S. Pat. No. 6,021,042 discloses a ventilation device comprising two ventilators connected in parallel in order to dissipate the heat from electronic component groups of a computer. Each ventilator produces an air flow which is directed onto two processor component groups to be ventilated, via a mixing chamber. Swing-type check valves are arranged in the mixing chamber such that in the event of a fault, each air flow produced can be directed respectively onto one of the processor component groups to be cooled. There are applications for which the mechanical outlay for the mixing chamber and the air baffle devices connected thereto is too big and/or the required space is not available.

In many cases the mechanical components of the air generating device are also already integrated into the subrack and specified by the manufacturer. To increase fault tolerance it is possible to configure only the control electronics redundantly on the user side.

SUMMARY OF THE INVENTION

One object of the present invention is to improve the reliability of a ventilation device of the type mentioned at the start, without too much expense.

This object is achieved by the claims.

With the ventilation device according to the invention, each component group is assigned a temperature monitoring device. As soon as the operating temperature of a component group exceeds a predetermined limit value, the temperature monitoring device through-connects a switching device. This switching device is located in the bypass for a control element, which serves to control the energy supply of the fan drives. In the event of a fault, the temperature-controlled through-connection of the bypass enables each component group to be individually protected, whereby the fan drives are switched to maximum speed, thereby producing the maximum cooling effect. The switching arrangement according to the invention can be configured at comparatively low cost. The bypass switching device can be fashioned using non-contacting semiconductor switches, reed relays or the like. Integrated switching circuits are commercially available to implement the temperature monitoring on a printed circuit board, and generate an output signal in the event of a fault, it being possible for said signal to be directly switched to the control input of a semiconductor switch, for instance the gate of a field effect transistor. The invention achieves a compact, cost-effective ventilation device, with comparatively high fault tolerance.

It is favorable for the switching elements of the bypass switching device to be arranged respectively on the component group which is to be protected. The transmission path from the temperature sensor to the bypass switch can thereby be kept short.

A compact design can thereby be achieved by combining the temperature monitoring device assigned to a component group and the switching element in each case to form a switching unit.

An arrangement is preferable whereby the switching units and the control unit for the fan drives are accommodated on locally separate component groups. An uninterruptible operation of the fan drives is thus possible, even if the control unit is temporarily removed for servicing reasons.

It is favorable in terms of the manufacturing costs for the individual switching elements of each component group to be switched respectively to a single common backplane line. This enables a low-cost, so-called wired-or connection, which only requires a small amount of space on the backplane board.

It is particularly advantageous for each switching element to be configured as a semiconductor switching element. Field effect power transistors are preferably used in MOSFET technology.

A particularly low failure rate of the ventilation device can thus be achieved if at least one fan unit is driven by a brushless motor with an integrated tachogenerator. In the case of a brushless motor, the commutation takes place with no wear by means of electronic switching elements. Since no brushes are present, no sparks are formed during the commutation process, which could result in electromagnetic malfunctions.

The temperature monitoring device advantageously comprises a sensor diode, which is integrated into an integrated switching circuit of an electronic component of the component group. This chip-integrated arrangement enables external temperature monitoring directly at those components which generate the most heat. Thermal time constants which temporally delay temperature recording are thus not present.

Processors can be particularly effectively protected against excessive heating by means of this switching arrangement.

If the control unit is connected to a control computer via a bus, the ventilation can be controlled using a superordinate computer system. The bus can be formed by data lines of the backplane to which the component groups are connected. The superordinate computer system can be arranged on a component group or integrated into the control unit. In the event of a fault, whereby the ventilation device operates at an increased rotational speed and with increased noise, the computer system can interrogate the current rotational speed of the fan and if necessary generate corresponding alarm signals or controls signals, or display them. Particularly preferable are standardized bus systems, such as the System Management Bus (SMB bus), the Intelligent Platform Management Bus (IPMB bus) or the I²C bus.

The invention can be advantageously applied in telecommunication devices for ventilating printed circuit board component groups arranged vertically or horizontally in a subrack according to the CompactPCI Standard.

BRIEF DESCRIPTION OF THE DRAWINGS

The subject of the invention is illustrated in more detail below with reference to the drawings, in which.

DETAILED DESCRIPTION OF THE INVENTION

Figure 1:
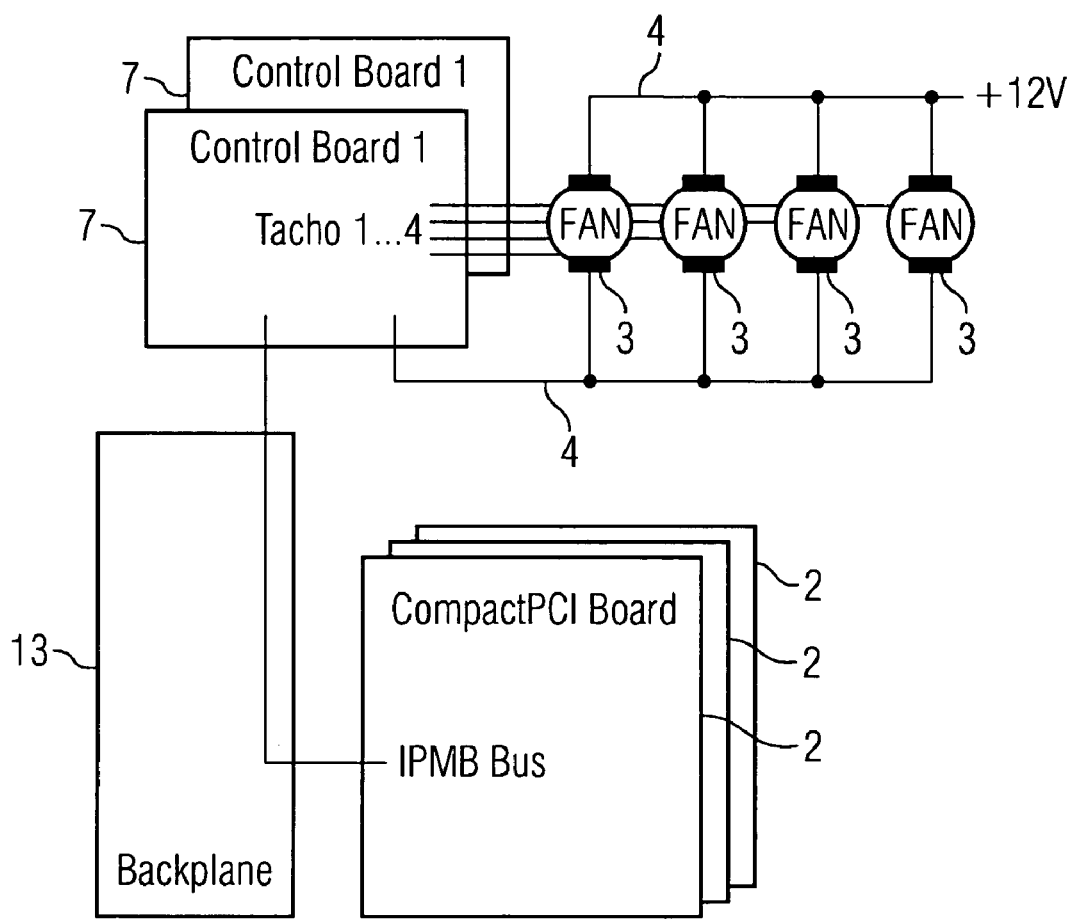
FIG. 1 shows a schematic representation of a ventilation device according to the prior art

FIG. 1 shows a schematic representation of a known ventilation device in an embodiment having four fans 3. The air flow generated by the fans 3 is directed onto the component groups 2 which are to be ventilated via air baffle devices not shown in further detail in FIG. 1. Three component groups 2 are schematically represented in the drawing, which plug into a common backplane board in a subrack. Each component group 2 is connected to the control unit 7 via an IPMB bus illustrated using a dash. The ventilation is thereby monitored in that the speed of the fans 3 is regulated by means of fed-back tacho signals 1 . . . 4 through the control unit (7) (Control Board I). A second control unit (Control Board II) serves as a back-up to increase fault tolerance. To align the ventilation to fluctuating environmental conditions, the control unit can comprise temperature sensors which measure the temperature of the intake air at the fans and adjust the rotational speed of the fans as a function thereof. In contrast to the representation in FIG. 1, cost reasons may dictate the provision of only one tachogenerator (TG). In this case, the tacho voltage of this master drive serves as a control variable for the ventilation. As shown at the start, the redundant control electronics result in additional costs, which are unjustifiable in certain applications.

Figure 2:
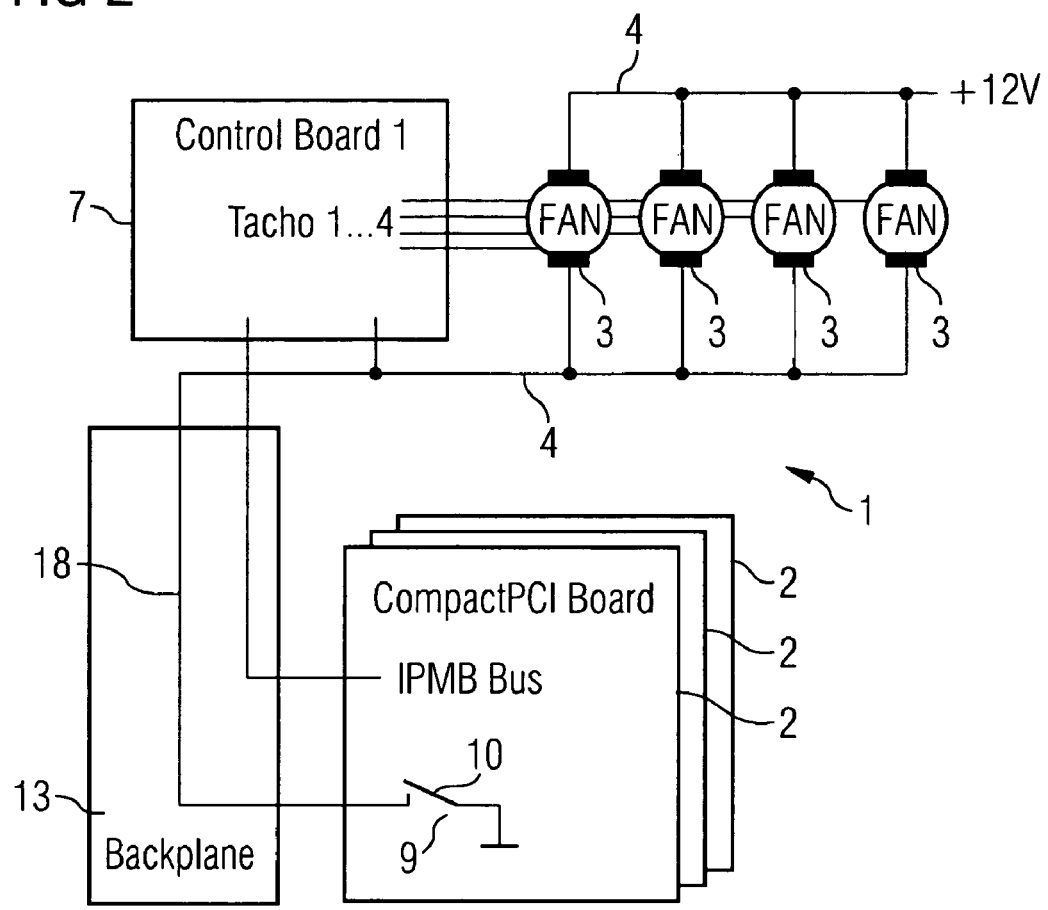
FIG. 2 shows a schematic representation of the ventilation device according to the invention

In contrast, FIG. 2 shows a schematic representation of the ventilation device according to the invention, whereby the redundant control system is not present. The fault is detected by a temperature sensor on component group 2 (Compact PCI Board). One switch designated by reference character 10 switches the connecting wire 4 of the fan drives 10 through to earth. The fan controller 7 is thereby bypassed using a bypass circuit. Consequently in the event of a fault, all four ventilators 3 are at full operating voltage (Vcc). In the example illustrated, this is the operating voltage 12 V. The fan drives 3 operate uncontrolled and at maximum speed.

Figure 3:
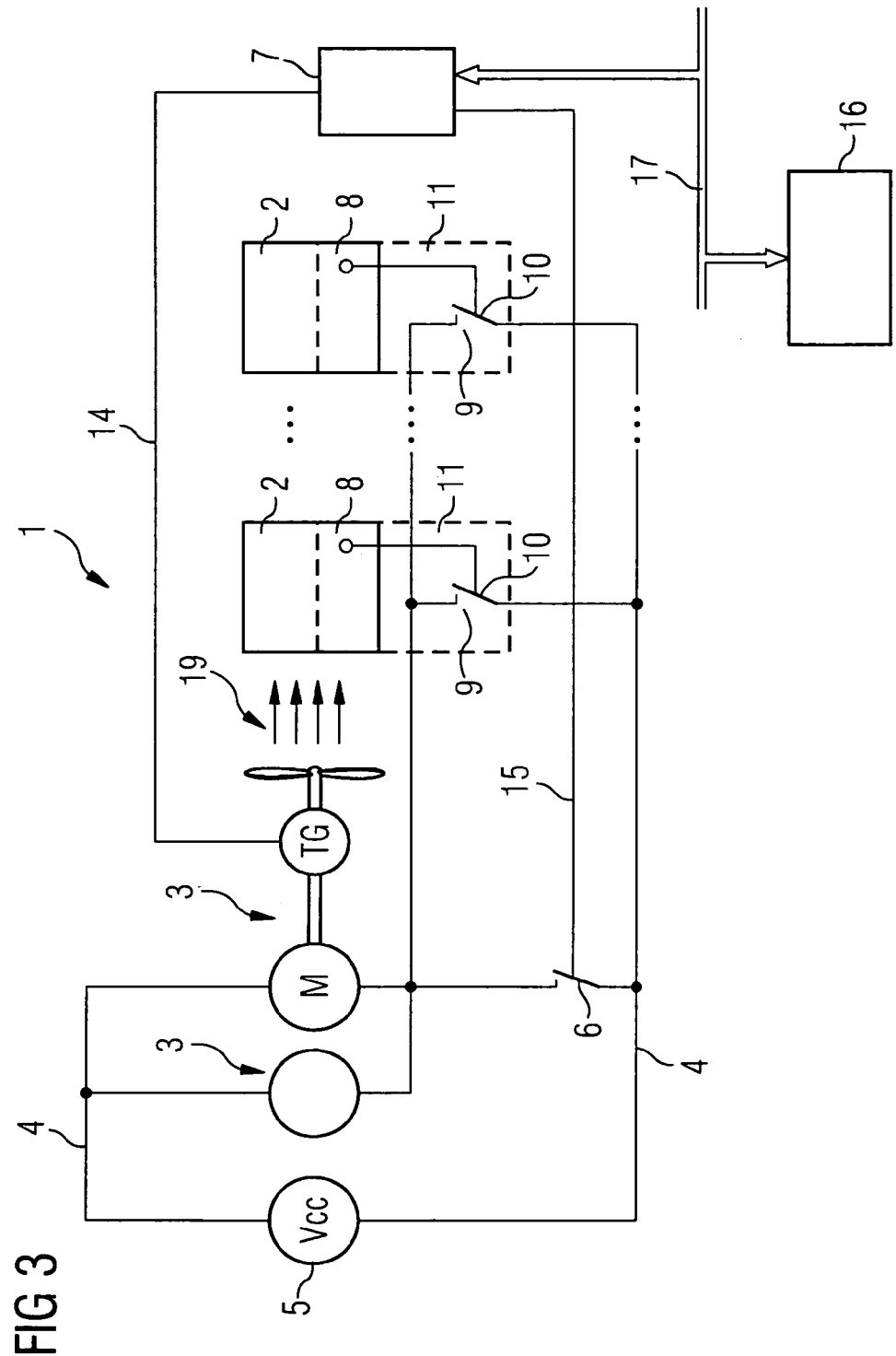
FIG. 3 shows a block diagram of the ventilation device according to the invention

The switch-over in the event of a fault can be more easily recognized from the block diagram displayed in FIG. 3. The ventilation system 1 according to the invention comprises several fan units 3, two of said fan units 3 being represented in the block diagram. Each of these ventilators 3 generates an air flow 19 which is directed onto the component groups 2 to be ventilated. The control unit 7 monitors this ventilation. To this end, the rotational speed of the ventilators is detected via a tachogenerator TG and fed back to the control unit 7 via a line 14. The control unit 7 produces a control variable which is routed to the control element 6 via a control line 15. The control element 6 is switched into the power circuit of the connecting wires 4. The connecting wires 4 connect each fan unit 3 to a power supply unit 5. The energy supply to the fan units is controlled and the ventilation monitored according to the control algorithm implemented in the control unit 7. By way of example, the energy supply to the motors of the fans 3 can be effected by clocking the armature current according to a pulse width modulation. If the situation arises in which the operating temperature on one of the component groups 2 exceeds a predetermined threshold value, for example due to a failure in the control unit 7, this inadmissible heating is detected by a monitoring device 8 on this component group 2 and the switch 10 is closed. The switch 10 is located in a parallel circuit to the control element 6. In the event of a fault, the closing of the switch 10 causes all the drives of the fan units 3 to be directly switched to the power supply unit 5. They are operated at full operating voltage and run at maximum speed. Each fan unit 3 produces a maximum air flow which counteracts the heating. It must be emphasized here that the bypassing of the control element 6 can be initiated by any of the component groups 2. The bypass circuit is independent of the functional status of the control unit 7 and independent of the recording of the actual speed. The temperature-controlled bypass circuit has the advantage that a switch-over to increased ventilation also takes place if, in the case of an arrangement comprising several fans in which only the tacho voltage of a master drive is fed back to the control unit 7, a rotor is mechanically blocked. In the preferred exemplary embodiment of FIG. 3, the temperature monitoring system 8 assigned to a component group 2 is combined with the assigned switching element 10 respectively to form a switching unit 11. The switching unit 11 is arranged on component group 2. The switching unit in the block diagram shown in FIG. 3 is illustrated using a dashed line.

The control unit 7 is connected to a superordinate computer system 16 via a data bus 17. This enables the rotational speed of the fans to be recorded and forwarded to a suitable display device. Similarly it is possible for the computer system 16 to be located on one or a plurality of component groups 2, and to be connected to the control unit 7 via the data bus 17.

Figure 4:
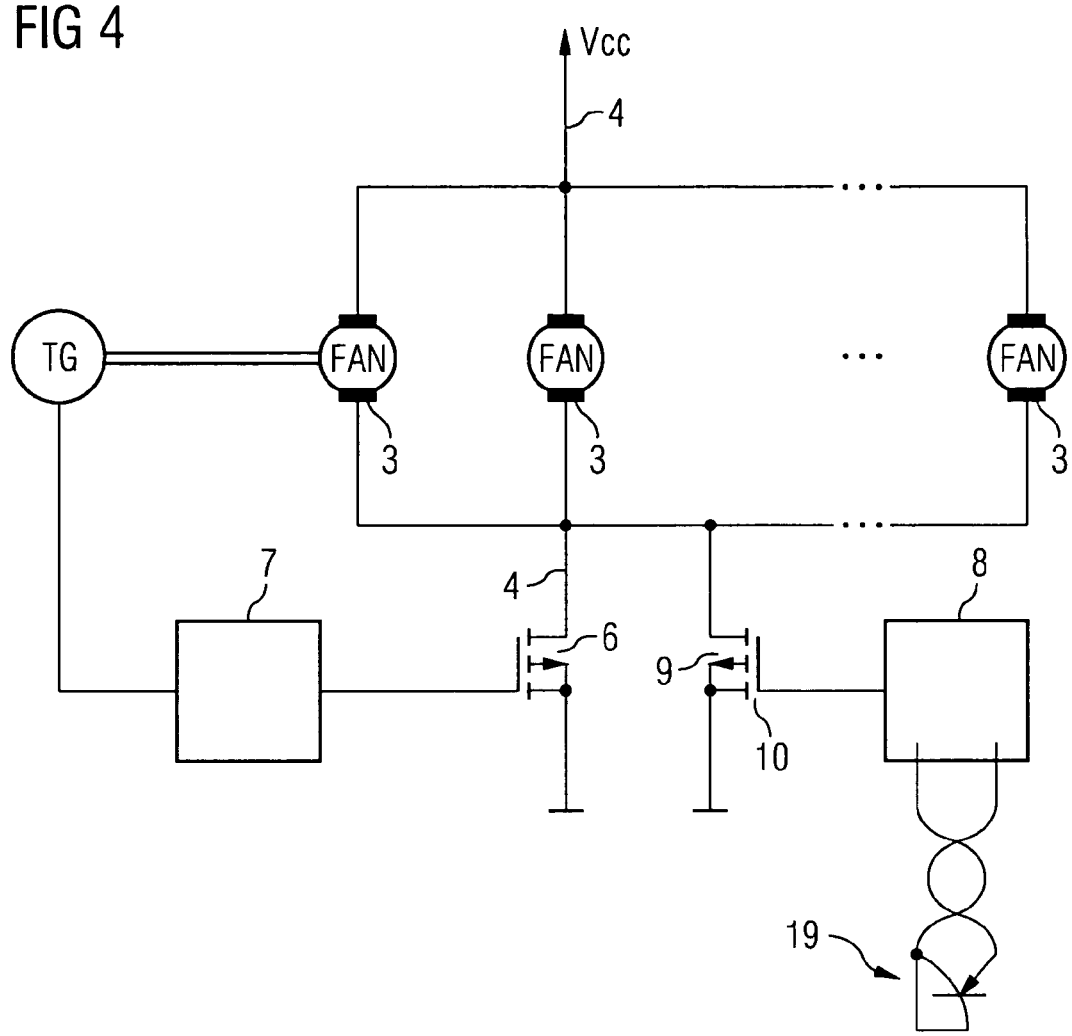
FIG. 4 shows a preferred exemplary embodiment of the ventilation device according to the invention having a sensor diode for recording the temperature

FIG. 4 displays a further preferred embodiment of the invention. The control element 6 and the switching device 9 are configured in MOSFET technology. The excess temperature is recorded using a sensor diode 19, the measuring signal of which is switched to the temperature monitoring device 8. The sensor diode 19 is preferably integrated into an integrated circuit of an electronic component to be monitored. This component can be a processor for example. As the heating is recorded directly in situ by means of a chip-integrated sensor, the ventilation system can react quickly to local excess temperature, since delays due to thermal time constants are largely eliminated.

Figure 5:
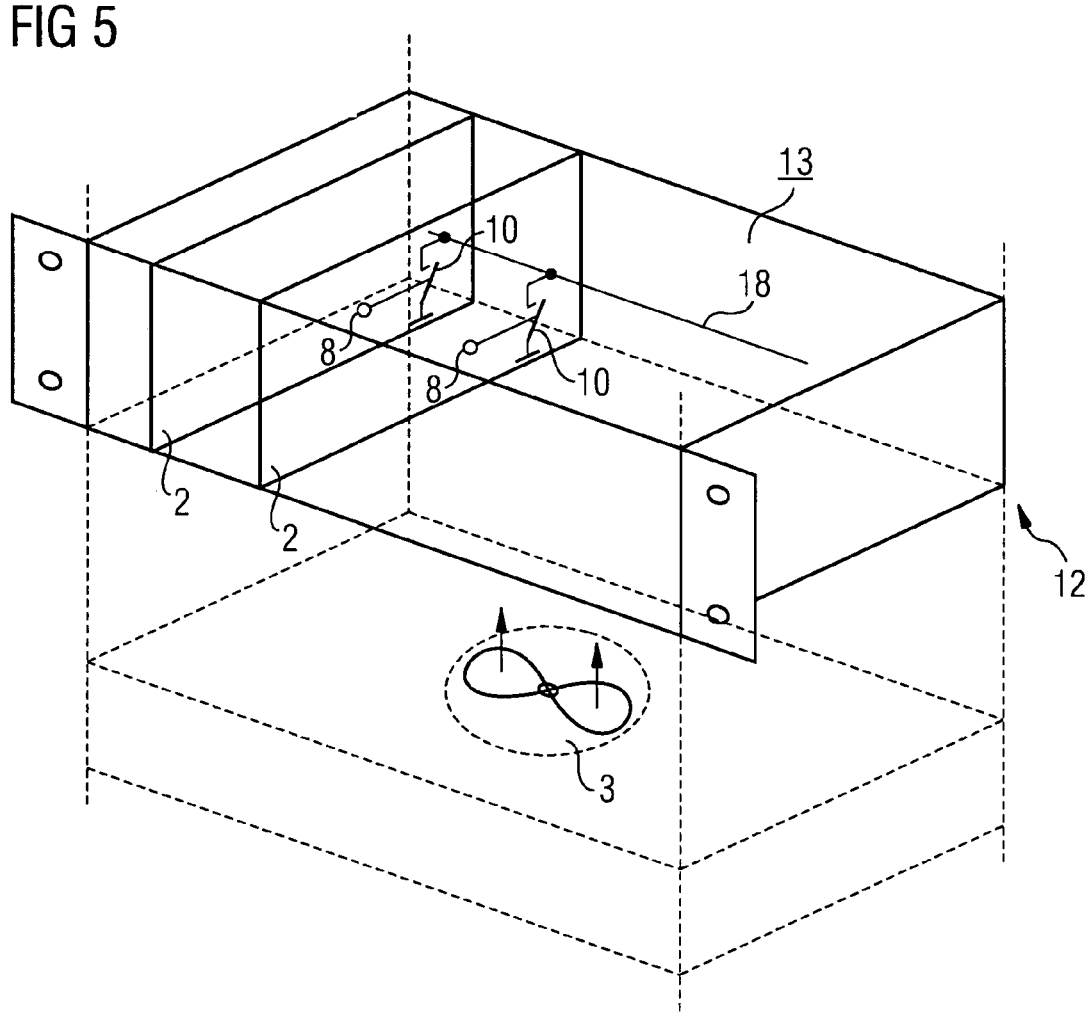
FIG. 5 shows a preferred arrangement of the ventilation device according to the invention in a subrack whereby the bypass switching elements are switched to a common circuit path on the backplane board.

FIG. 5 displays a special embodiment of the invention, wherein the switching elements 10 of each component group 2 are connected to a common circuit path 18 of the backplane 13. By means of the parallel switching of the switches 10, each component group 2 can through-connect the bypass connection and initiate an increased cooling effect in the event of a fault. The representation of FIG. 5 shows the component group 2 in a vertical mounting position. The fan units 3 are arranged in a unit located below them. Naturally the component groups 2 in the subrack can also be arranged horizontally and the fans 3 arranged laterally.

The invention claimed is:

1. A ventilation device for ventilating boards mounted in a support unit, the ventilation device comprising:
   at least one fan unit connected to a power supply unit by connecting wires;
   a control unit for monitoring and regulating the at least one fan unit, wherein the control unit controls a control element arranged in a power circuit of the connecting wires, wherein the control unit provides alarm or control signals for transmittal over a bus including signals indicative of an alarm condition relating to increased rotational speed or noise in the fan unit; and
   temperature monitoring and switching circuitry including a temperature monitoring device and a switching device connected in parallel with the control element, the circuitry configured to detect and respond to a fault in the fan unit by bypassing the control unit and through-connecting the switching device to power the fan unit at full operating voltage when a board temperature is greater than a board limit temperature, the temperature monitoring device comprising a sensor diode integrated in an integrated circuit of an electronic component of the respective board.

2. The ventilation device according to claim 1, including multiple fan units connected to the power supply, wherein the switching device includes multiple switching elements operatively connected to power the multiple fan units.

3. The ventilation device according to claim 2, wherein the boards in the support unit are arranged in a pluggable manner in a backplane, and the parallel switching of the switching elements with the control element is established via a backplane line in common to the switching elements.

4. The ventilation device according to claim 2, wherein each switching element is configured as a semiconductor switching element.

5. The ventilation device according to claim 4, wherein the semiconductor switching elements are power MOSFETs.

6. The ventilation device according to claim 2, wherein the fan unit has a brushless motor with integrated tachogenerator as a drive.

7. The ventilation device according to claim 1, wherein the switching device and the control unit are arranged in the support unit separate from one another.

8. The ventilation device according to claim 1, wherein the boards in the support unit are arranged in a pluggable manner in a backplane, and parallel switching of the switching device relative to the control element is established via a backplane line in common to the switching elements.

9. The ventilation device according to claim 1, wherein the fan unit has a brushless motor with integrated tachogenerator as a drive.

10. The ventilation device according to claim 1, wherein the sensor diode is for temperature recording.

11. The ventilation device according to claim 1, wherein four fan units are arranged in a support unit, and are monitored jointly by the control unit configured as an integrated controller module.

12. The ventilation device according to claim 1, wherein the control unit is connected to a control computer by the bus to display alarm or control signals.

13. The ventilation device according to claim 12, wherein the bus is configured as a System Management Bus (SMB bus), Intelligent Platform Management Bus (IPMI bus) or $I^2C$ bus.

* * * * *